United States Patent
Ma et al.

(10) Patent No.: US 7,902,635 B2
(45) Date of Patent: Mar. 8, 2011

(54) HIGH-POWER-GAIN, BIPOLAR TRANSISTOR AMPLIFIER

(75) Inventors: Zhenqiang Ma, Middleton, WI (US); Ningyue Jiang, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 1010 days.

(21) Appl. No.: 11/178,644

(22) Filed: Jul. 11, 2005

(65) Prior Publication Data

US 2007/0007626 A1    Jan. 11, 2007

(51) Int. Cl.
*H01L 27/082*   (2006.01)
(52) U.S. Cl. .... 257/592; 257/591; 257/574; 257/E29.04; 257/E29.256; 257/E29.27
(58) Field of Classification Search .......... 257/491–492, 257/574, 591–592
See application file for complete search history.

(56) References Cited

U.S. PATENT DOCUMENTS

| | | | | |
|---|---|---|---|---|
| 5,304,816 | A | * | 4/1994 | Grinberg et al. ................ 257/26 |
| 5,329,144 | A | * | 7/1994 | Luryi ............................ 257/197 |
| 2003/0048138 | A1 | * | 3/2003 | Van De Westerlo et al. . 330/311 |
| 2005/0139921 | A1 | * | 6/2005 | Kang et al. .................... 257/347 |

OTHER PUBLICATIONS

N.L. Wang, et al., Ultrahigh Power Efficiency Operation of Common-Emitter and Common-Base HBT's at 10 GHz, IEEE Transactions on Microwave Theory and Techniques, vol. 38, No. 10, Oct. 1990.

* cited by examiner

*Primary Examiner* — A. Sefer
(74) *Attorney, Agent, or Firm* — Boyle Fredrickson, S.C.

(57) ABSTRACT

Improved radio frequency gain in a silicon-based bipolar transistor may be provided by adoption of a common-base configuration, preferably together with excess doping of the base to provide extremely low base resistances boosting performance over similar common-emitter designs.

6 Claims, 3 Drawing Sheets

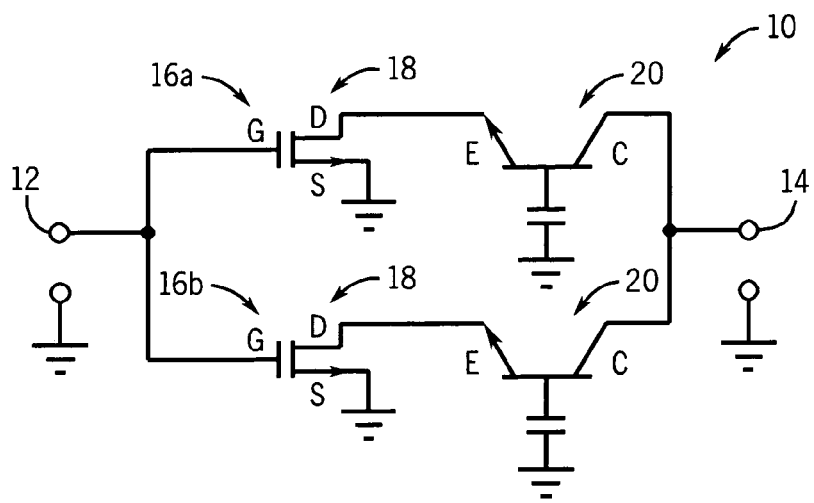
FIG. 1
FIG. 2
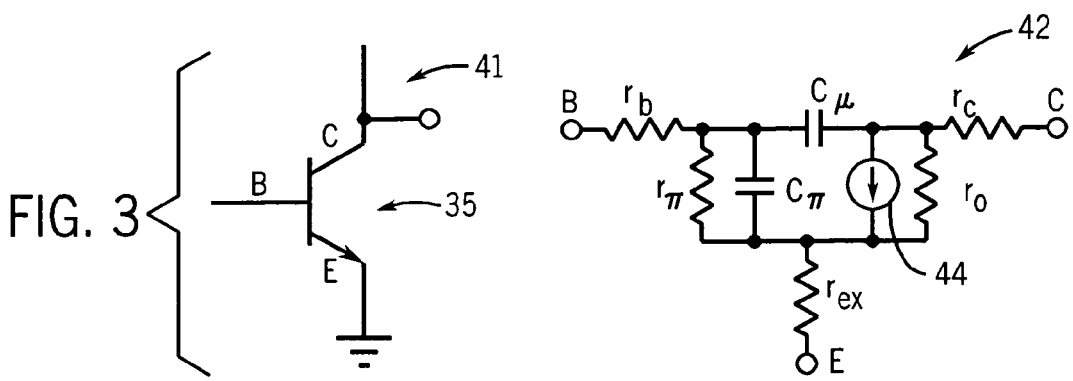
FIG. 3

US 7,902,635 B2

HIGH-POWER-GAIN, BIPOLAR TRANSISTOR AMPLIFIER

STATEMENT REGARDING FEDERALLY SPONSORED RESEARCH OR DEVELOPMENT

This invention was made with United States government support awarded by the following agency: NSF 0323717. The United States has certain rights in this invention.

CROSS-REFERENCE TO RELATED APPLICATIONS

BACKGROUND OF THE INVENTION

This invention relates generally to high frequency transistor amplifiers and in particular to a silicon transistor and circuit suitable for high gain, high frequency amplification.

High frequency electrical amplifiers, such as those useful for radio frequency (RF) and microwave power amplification, frequently use transistors fabricated from gallium arsenide or other column III-V elements instead of silicon. Transistors using III-V semiconductors, however, are generally incompatible with large-scale integrated circuit techniques, such as the complementary metal oxide semiconductor (CMOS) process, used in the fabrication of logic circuitry. For this reason, integrated circuits providing both logic circuitry and high-powered radio frequency amplification are not easily manufactured.

Recently, the use of silicon transistors in high frequency amplification has become increasingly practical with smaller line width devices possible with advanced fabrication techniques. Nevertheless, improved power gain at radio frequencies would be desirable.

BRIEF SUMMARY OF THE INVENTION

The present invention provides improved power gain at radio frequencies, including microwave frequencies using silicon transistors, by using a common-base configuration-based amplifier design. The power gain of silicon transistors is further improved together with a transistor having a doping profile optimized for that amplifier design. The transistor doping varies from the normal high to low doping concentration from emitter to base by significantly increasing the base doping. This doping significantly decreases the base resistance relative to the total emitter resistance (including the emitter resistance and parasitic emitter resistance) substantially improving the power gain over that obtainable with a similar common-emitter design or a common-base design using a conventionally doped transistor.

The common-base design further provides improved breakdown voltage over the common-emitter design useful in applications where a high degree of ruggedness against overvoltage (or a large safe operation area) is required. An amplifier cell combining the amplifier of the present invention with a field-effect transistor (FET) front end termed: "FET disciplined bipolar transistors" or FDBT can provide optimized, concurrent high-power and high-frequency operation with improved performance against thermal effects.

Specifically then, the present invention provides an amplifier having a silicon bipolar transistor with a predetermined relative doping concentration in the base and emitter regions such that the base resistance $r_b$ is less than or equal to the sum of the emitter resistance $r_e$ and the parasitic emitter resistance $r_{ex}$. Input terminals provide an input across the emitter and base of the transistor and output terminals provide an output across the collector and base of the transistor so that the transistor may be operated in common-base configuration.

It is thus one object of at least one embodiment of the invention to optimize a common-base transistor amplifier through a specially doped transistor providing a very low base resistance.

The silicon bipolar transistor may be a silicon bipolar junction transistor or a silicon-germanium heterojunction bipolar transistor.

Thus it is another object of at least one embodiment of the invention to provide an amplifier that can be used with a variety of silicon transistor types.

The amplifier may include at least one field-effect transistor driving the input terminals, for example, with the drain (source as ground) of the field-effect transistor driving the emitter (base as AC ground) of the silicon bipolar transistor.

It is thus another object of at least one embodiment of the invention to provide an amplifier cell that may effectively combine the high breakdown voltage of the common-base transistor with a low breakdown voltage but high frequency operation of the field-effect transistor.

It is another object of at least one embodiment of the invention to provide a power cell that eliminates the need for ballast resistors by using multiple FETs to promote the sharing of current among the bipolar transistors. It is another object of at least one embodiment of the invention to provide an amplifier cell with reduced sensitivity to heating by employing field-effect transistors with reduced sensitivity to heating.

These particular objects and advantages may apply to only some embodiments falling within the claims and thus do not define the scope of the invention.

BRIEF DESCRIPTION OF THE DRAWINGS

FIG. 1 is a schematic representation of an amplifier cell using a combined field-effect transistor and bipolar junction transistor (FDBT), the latter in a common-base configuration and preferably doped per the present invention;

FIG. 2 is a set of three linked graphs, the right graph showing power gain in decibels as a function of the logarithm of frequency for a common-emitter bipolar transistor and a common-base bipolar transistor with two different doping schemes shown in left graphs, each showing doping concentration as a function of spatial location within the emitter base and collector regions, the upper graph showing a conventional doping pattern and the lower graph showing a doping pattern to reduce base resistance;

FIG. 3 is a schematic representation of a generic common-emitter design (to the left) and the hybrid-π model for the transistor in that design (to the right) as defines variables referenced in the present specification;

DETAILED DESCRIPTION OF THE PREFERRED EMBODIMENT

Figure 4:
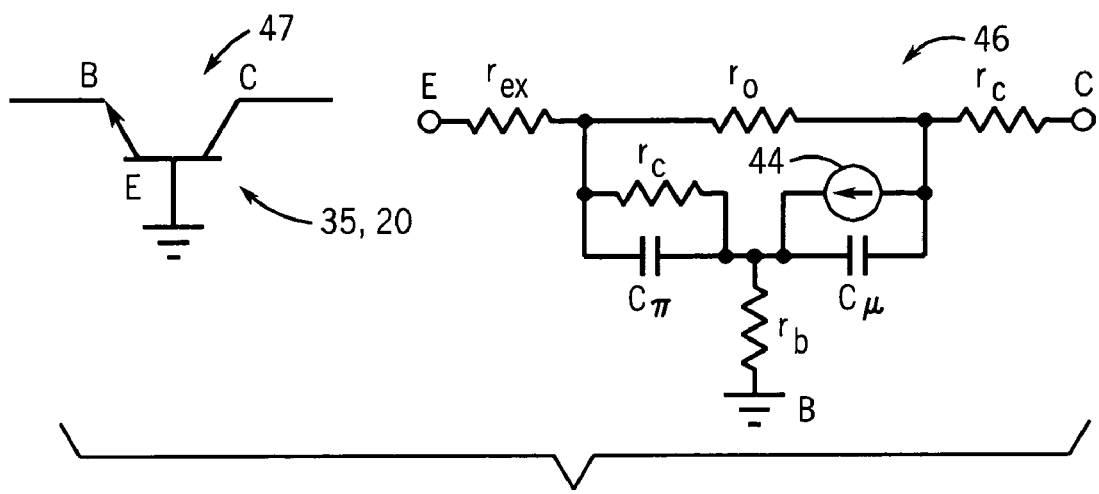
FIG. 4 is a figure similar to that of FIG. 3 showing a generic common-base amplifier design and the T model for the transistor of that design.

Referring now to FIG. 1, the present invention may be used, in one embodiment, to create an amplifier cell 10 having input terminals 12 for receiving a signal to be amplified and output terminals 14 providing an output signal, such as a radio frequency signal to an antenna.

The amplifier cell 10 may employ multiple amplifier rows 16 (only two of which are shown for clarity), providing parallel current paths. Each row 16 includes at least one series connected of a field-effect transistor 18 and a bipolar transistor 20. The latter bipolar transistor 20 may be a bipolar junction transistor (BJT) or heterojunction bipolar transistor (HBT).

The bipolar transistor 20 is arranged in common-base configuration in which the base of the bipolar transistor 20 (marked by the letter "B") is referenced to signal AC ground. The collector (marked by the letter "C") is attached to the output terminal 14 and the emitter (marked by the letter "E") is connected to the drain (marked by the letter "D") of the field-effect transistor 18.

The source of the field-effect transistor 18 (marked by the letter "S") is connected to ground and the gate (marked by the letter "G") is connected to the input terminal 12. Generally therefore, a signal at the gate of field-effect transistor 18 controls the current from drain to source of the field-effect transistor 18 in turn controlling the current from collector to emitter of the bipolar transistor 20.

Referring now to FIG. 2, the doping profile 22 of a standard bipolar transistor 35 intended for a common-emitter amplifier design provides for a decreasing concentration of dopant as one moves from the emitter region 24 to the base region 26 and to the collector region 28. Such a bipolar transistor 35, when used in a common-emitter configuration, produces a common-emitter gain curve 30 providing generally decreasing power gain as frequency increases, where power gain may be measured as maximum available gain (MAG), and maximum stable gain (MSG) in decibels.

Alternatively, when a bipolar transistor 35 of this type is used in a common-base configuration, a common-base gain curve 32 is produced, again providing power gain as a function of frequency, typically having less power gain than the common-emitter design for the majority of a generally useful frequency range 34.

In the present invention, a doping profile 22 can be employed with the bipolar transistor 20 of FIG. 1. With the configuration of FIG. 1, a high breakdown voltage from the base collector junction of bipolar transistor 20 is available. The use of ballast resistors generally for maintaining thermally stable operation of multiple parallel bipolar transistor 20 is thus eliminated. Power performance, including output RF power, power gain, power-added efficiency and overvoltage, is improved.

In another embodiment of the present invention, a doping profile 36 is employed with the bipolar transistor 20 of FIG. 1 in which the doping in the base region 26 is substantially increased with respect to the doping in emitter region 24 and collector region 28. This change in doping profile 36 results in an enhanced common-base gain curve 40 outperforming the common-emitter gain curve 30 for a widened useful frequency range 37. This improvement in the enhanced common-base gain curve 40 results from a decrease in the effective base resistance of the bipolar transistor 20 as will now be explained.

Referring to FIG. 3, a bipolar transistor 35 in a common-emitter configuration 41 may be modeled according to a small signal hybrid π model 42 in which the operating characteristics of the transistor 35 are represented by equivalent capacitors, resistors and current sources. Hybrid π model 42 is augmented with elements representing parasitic emitter resistance $r_{ex}$ and the collector resistance $r_c$. These two resistances $r_{ex}$ and $r_c$ are normally ignored because of their negligible value in comparison to the total base resistance $r_b$ for doping profile 22, however, for higher doping concentrations in the base region 26 of doping profile 36, $r_b$ can be reduced to a much smaller value and becomes comparable to $r_{ex}$ and $r_c$.

In this small-signal hybrid π model 42 of a bipolar transistor 35 in a common-emitter configuration 41, the base terminal of the bipolar transistor 35 connects through a resistance $r_b$ to a junction with a capacitor $C_\mu$ (also named as $C_{BC}$), $C_\pi$ and resistor $r_\pi$. The latter two elements, $C_\pi$ and $r_\pi$, are connected in parallel between resistor $r_b$ and a junction of resistor $r_{ex}$, a current source 44 equal to $g_m v_{BE}$ where $v_{BE}$ is the voltage across resistor $r_\pi$, and a resistor $r_o$. The remaining end of resistor $r_{ex}$ connects to the emitter terminal of the device.

The remaining end of $C_\mu$ connects to the remaining terminals of the current source 44, resistor $r_o$ and resistor $r_c$ the latter of which leads to the collector terminal.

Referring to FIG. 4, similarly a small-signal T-model 46 (equivalent to hybrid π model 42) may be created for the common-base configuration 47 of bipolar transistor 35 or 20. The small signal T-model 46 provides for a resistor $r_{ex}$ joining the emitter to the common junction of a resistor $r_o$ and the parallel combination of resistor $r_e$ and capacitor $C_\pi$. The remaining terminals of resistor $r_e$ and capacitor $C_\pi$ in turn connect to a junction of a base resistance $r_b$, a current equal to $g_m v_{BE}$ where $v_{BE}$ is the voltage across resistor $r_e$, and a capacitor $C_\mu$.

The remaining end of $r_o$ connects to the remaining terminals of the parallel connected current source 44 and capacitor $C_\mu$, and to resistor $r_c$, the latter of which leads to the collector terminal.

The H-parameters of the small signal hybrid π model 42 representing the common-emitter configuration 41 are derived as the following where subscript symbols: i stands for input port; o stands for output port; r stands for reverse transmission; f stands for forward transmission; e stands for common-emitter; and b stands for common-base, according to well known convention:

$$h_{ie} = r_b + \frac{\left(\frac{1}{j\omega C_\mu} + r_c\right)[Z_1 + r_{ex}(1 + g_m Z_1)]}{\frac{1}{j\omega C_\mu} + Z_1 + (r_{ex} + r_c)(1 + g_m Z_1)} \quad (1)$$

$$h_{re} = \frac{r_{ex}(1 + g_m Z_1) + Z_1}{\frac{1}{j\omega C_\mu} + Z_1 + (r_{ex} + r_c)(1 + g_m Z_1)} \quad (2)$$

$$h_{fe} = \frac{\frac{g_m Z_1}{j\omega C_\mu} - Z_1 - r_{ex}(1 + g_m Z_1)}{\frac{1}{j\omega C_\mu} + Z_1 + (r_{ex} + r_c)(1 + g_m Z_1)} \quad (3)$$

$$h_{oe} = \frac{1 + g_m Z_1}{\frac{1}{j\omega C_\mu} + Z_1 + (r_{ex} + r_c)(1 + g_m Z_1)} + \frac{1}{r_o} \quad (4)$$

where $Z_1$ is given by $$Z_1 = \frac{r_\pi}{1 + j\omega r_\pi C_\pi} \text{ and } r_\pi = \frac{\beta}{g_m}, g_m = \frac{qI_c}{kT}$$

where kT=26 meV.

These four H-parameters, $h_{ie}$, $h_{re}$, $h_{fe}$ and $h_{oe}$ are equivalent to $h_{11}$, $h_{12}$, $h_{21}$ and $h_{22}$ in the general two-port network format, respectively.

Similarly, the H-parameters for the small signal T model 46 representing the common-base configuration 47 can be derived as:

$$h_{ib} = \frac{r_b(1 - g_m Z_2 + j\omega r_c C_\mu)}{1 + j\omega C_\mu (r_b + r_c)} + r_{ex} + Z_2 \quad (5)$$

$$h_{rb} = \frac{r_b\left(\frac{1 - g_m Z_2}{Z_2 + r_o} + j\omega C_\mu\right) + \frac{Z_2}{Z_2 + r_o}}{1 + \left(\frac{1 - g_m Z_2}{Z_2 + r_o} + j\omega C_\mu\right)(r_b + r_c)} \quad (6)$$

$$h_{fb} = -\frac{g_m Z_2 + j\omega r_b C_\mu}{1 + j\omega C_\mu (r_b + r_c)} \quad (7)$$

$$h_{ob} = \frac{1}{r_b + r_c + \frac{1}{j\omega C_\mu + \frac{1 - g_m Z_2}{Z_2 + r_o}}} \quad (8)$$

where $Z_2$ is given $$Z_2 = \frac{r_e}{1 + j\omega r_e C_\pi} \text{ and } r_e = \frac{1}{g_m + \frac{1}{r_\pi}} = \frac{\beta}{g_m(1+\beta)} = \frac{\alpha}{g_m}$$

In order to calculate the difference/ratio of power gain between two configurations, approximations, justified by actual values, may be made to simplify the derived H-parameters and the power gain expressions in different frequency ranges. Since most of the transistors 35, 20 are operated in the intermediate frequency range within the $f_{max}$ of the devices (for RF and microwave power amplification) and the devices are potentially unstable in this frequency range, it is imperative to specifically consider the maximum stable power gain (MSG) in this useful frequency range. MSG can be expressed in terms of H-parameters as shown in Eq. 9:

$$MSG = \left|\frac{h_f}{h_r}\right| \quad (9)$$

From Eqs. 2 and 3, the maximum stable gain MSG for the common-emitter configuration 41 can be derived as the following:

$$MSG_e = \left|\frac{\frac{g_m Z_1}{j\omega C_\mu} - Z_1 - r_{ex}(1 + g_m Z_1)}{r_{ex}(1 + g_m Z_1) + Z_1}\right| = \left|\frac{\frac{g_m Z_1}{j\omega C_\mu}}{r_{ex}(1 + g_m Z_1) + Z_1} - 1\right| \quad (10)$$

Under the assumption MSG>>1 and $|g_m Z_1| \approx \beta >> 1$ in the intermediate frequency range and using approximation $$\alpha \approx 1, r_e = \frac{\alpha}{g_m} \approx \frac{1}{g_m}.$$

Eq. 10 can be simplified as:

$$MSG_e \approx \left|\frac{\frac{g_m Z_1}{j\omega C_\mu}}{r_{ex}(1 + g_m Z_1) + Z_1}\right| \approx \left|\frac{\frac{g_m Z_1}{j\omega C_\mu}}{r_{ex} g_m Z_1 + Z_1}\right| = \frac{1}{\omega C_\mu (r_{ex} + r_e)} \quad (11)$$

For the common-base configuration 47, since the value of $r_o$ is fairly large, Eq. 6 can thus be simplified as:

$$h_{rb} = \frac{j\omega r_b C_\mu}{1 + j\omega C_\mu (r_b + r_c)} \quad (12)$$

From Eqs. 7 and 12, MSG for the common-base configuration is:

$$MSG_b = \left|\frac{g_m Z_2 + j\omega r_b C_\mu}{j\omega r_b C_\mu}\right| = \left|\frac{g_m Z_2}{j\omega r_b C_\mu}\right| \quad (13)$$

Since MSG>>1 and $|g_m Z_2| \approx \alpha$, in the intermediate frequency range, Eq. 13 can be further simplified as, $$MSG_b = \frac{\alpha}{\omega r_b C_\mu} \quad (14)$$

It is noted, from Eqs. 11 and 14, that both $MSG_b$ and $MSG_e$ follow a —10 dB/decade degradation trend, which is commonly observed for MSG versus frequency. The ratio of MSG's between the common-base and common-emitter configurations, using $$r_e = \frac{\alpha}{g_m} \approx \frac{1}{g_m}$$

again, is:

$$\frac{MSG_b}{MSG_e} = \frac{\alpha(r_{ex} + 1/g_m)}{r_b} \approx \frac{r_{ex} + r_e}{r_b} \quad (15)$$

From Eq. 11 and Eq. 14, one can see that $MSG_e$ is dependent on $r_{ex}+r_e$ and $MSG_b$ is dependent on $r_b$.

For the common-base configuration 47, $MSC_b$ increases as $r_b$ decreases. In the present invention, the value of $r_b$ is decreased to less than $r_{ex}+r_e$ by the increased doping of the base region described above to provide performance using a common-base configuration that can be superior to the performance from a common-emitter configuration.

In the high frequency range, the devices are unconditionally stable. MAG can be expressed as, $$MAG = MSG(K - \sqrt{K^2 - 1}) \qquad (16)$$

where K is the Rollett's stability factor (the K-factor), $$K = \frac{2\text{Re}(Z_{11})\text{Re}(Z_{22}) - \text{Re}(Z_{12}Z_{21})}{|Z_{12}Z_{21}|} \qquad (17)$$

Due to the complication of the K-factor in MAG, a simplified expression of MAG for both CE and CB configurations is impossible to obtain. The relative size of $MAG_e$ and $MAG_b$ is compared qualitatively.

After converting the K-factor into the H-parameter representation and substituting Eq. 1-4 and Eq. 5-8 with appropriate approximations, the K-factor for the CE and the CB configurations can be derived, respectively, as, $$K_{CB} \approx [(r_b + 2r_{ex})C_\mu + r_e C_\pi]\omega = k_b \omega \qquad (18)$$

$$K_{CE} \approx \left[(r_{ex} + 2r_b)C_\mu + r_e C_\pi\left(1 + \frac{2r_b}{r_{ex}}\right)\right]\omega = k_e \omega \qquad (19)$$

A simple direct comparison shows that $k_e > k_b$. Consequently, the frequency point ($f_{K=1,CB}$) at which the K-factor of the CB configuration reaches unity (break-point of MSG/MAG) is larger than the corresponding frequency point of the CE configuration ($f_{K=1,CE}$), i.e., $f_{K=1,CB} > f_{K=1,CE}$. By comparing the slopes of $MAG_e$ and $MAG_b$ versus frequency using $d(MAG_e(dB))/d(\log \omega)$ and $d(MAG_b(dB))/d(\log \omega)$), it can be shown that $MAG_b$ decreases faster with frequency than $MAG_e$.

If $MSG_b > MSG_e$ (Eq. 15) for the case of $r_b < r_e + r_{ex}$, in light of the fact of $f_{K=1,CB} > f_{K=1,CE}$, then it is always true that $MAG_b > MAG_e$. If $MSG_b < MSG_e$ (Eq. 15) for the case of $r_b > r_e + r_{ex}$, the value of $k_e/k_b$ ($= f_{K=1,CB}/f_{K=1,CE}$, as seen from Eq. 18 and Eq. 19. It can be roughly approximated as $$1 + \frac{2r_b}{r_{ex}}$$

for simplicity) and that of $r_b/(r_e+r_{ex})$ ($=MSG_e/MSG_b$, Eq. 15) need to be compared in order to compare the relative size of $MAG_b$ and $MAG_e$. A straightforward comparison of these two ratios shows that $k_e/k_b > r_b/(r_e+r_{ex})$ regardless of relative size of $r_b$ and $r_e+r_{ex}$. When both MAG and frequency are plotted in logarithmic scale, $k_e/k_b > r_b/(r_e+r_{ex})$, in light of the fact that $MAG_b$ and $MAG_e$ merge together (with gain value of unity) at the same $f_{max}$, indicates that $MAG_b$ must be larger than $MAG_e$ in the frequency range of $f < f_{max}$. As a result, in the high frequency range, the CB configuration always offers higher power gain ($MAG_b$) than the CE configuration ($MAG_e$) in spite of the ratio of $MSG_b/MSG_e$.

In the present invention, common-base configuration in this high frequency range 38 of FIG. 2 is used to provide performance that is superior to the performance from a common-emitter configuration of a transistor using a profile 22. The dividing point between frequency range 34 and 38 is quarter of the cut-off frequency $f_T$ of a transistor having a profile of 22 under common-emitter configuration.

One can also notice that neither $MSG_e$ nor $MSG_b$ is dependent on the parasitic collector resistance $r_c$. Although increased $r_c$ can increase the RC delay (via $C_\mu \cdot r_c$) of the transistors 20, 35, which in turn reduces the device cut-off frequency $f_T$, there is no significant effect of $r_c$ on small-signal power gain within the frequency range of concern.

Figure 5:
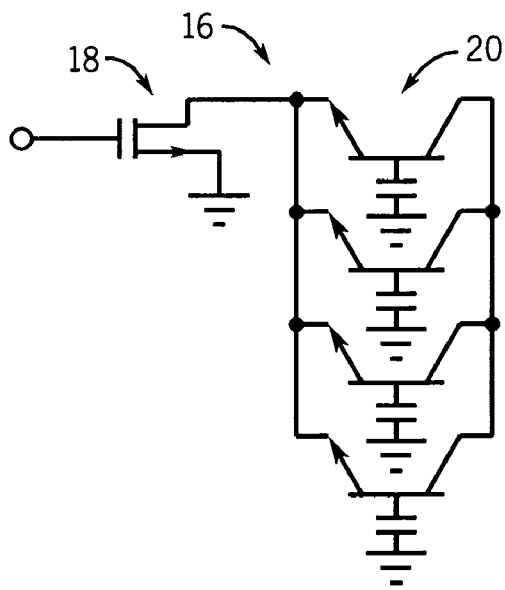
FIG. 5 is a figure similar to that of FIG. 1 showing a single FET feeding multiple bipolar transistors for increased fan out.

Referring now to FIG. 5, a given row 16a of the amplifier cell 10 may provide for multiple parallel bipolar transistor 20 limited to a number permitting effective current sharing between these bipolar transistors 20. These bipolar transistors 20 may be driven by a single field-effect transistor 18 to provide for fan out of that control.

Figure 6:
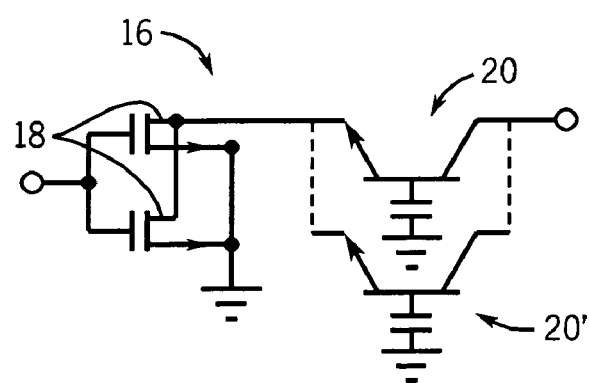
FIG. 6 is a figure similar to that of FIG. 5 showing multiple field-effect transistors providing current to a single bipolar transistor in a fan-in situation; or to multiple bipolar transistors for optimized fan-in and fan-out.

Conversely as shown in FIG. 6, each row 16 may provide for multiple field-effect transistors 18 connected in parallel to control the current through one bipolar transistor 20 for fan in of that control. These variations in amplifier cell 10 of FIG. 1 match the available power of the devices in a given fabrication.

Alternatively as shown in FIG. 6, the multiple field-effect transistors 18 connected in parallel may control multiple parallel bipolar transistors 20 and 20' for optimized power delivery, connectivity. The number of parallel bipolar transistors 20 is limited by thermal effects that can be tolerated by these transistors 20 in parallel. A large number of parallel bipolar transistors 20 without using ballast resistors is not recommended.

Figure 7:
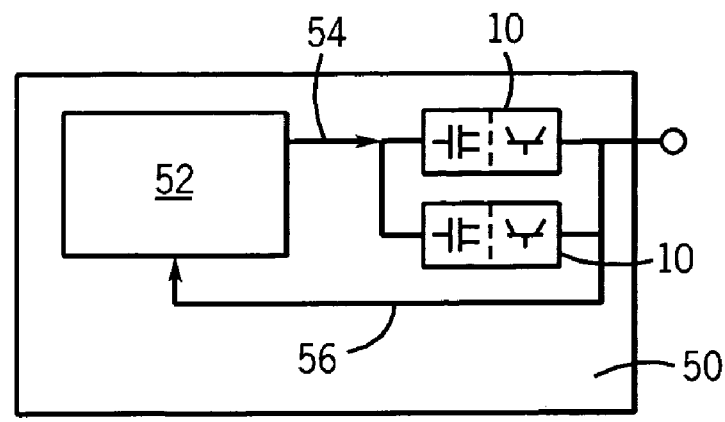
FIG. 7 is a block diagram of an integrated circuit providing for both CMOS logic circuitry and power cells per the present invention.

Referring to FIG. 7, the amplifier cells 10 may be fabricated on a substrate 50 together with conventional CMOS-type logic circuitry 52, the latter which may be used to provide signal to the amplifier cells 10 per line 54 and to receive feedback or monitoring signals per line 56. The present invention, by providing improved power gain in silicon devices, makes such bipolar CMOS integration valuable in a variety of applications including radio transmitters and the like where extensive digital domain processing of signals may be desirable.

Figure 8:
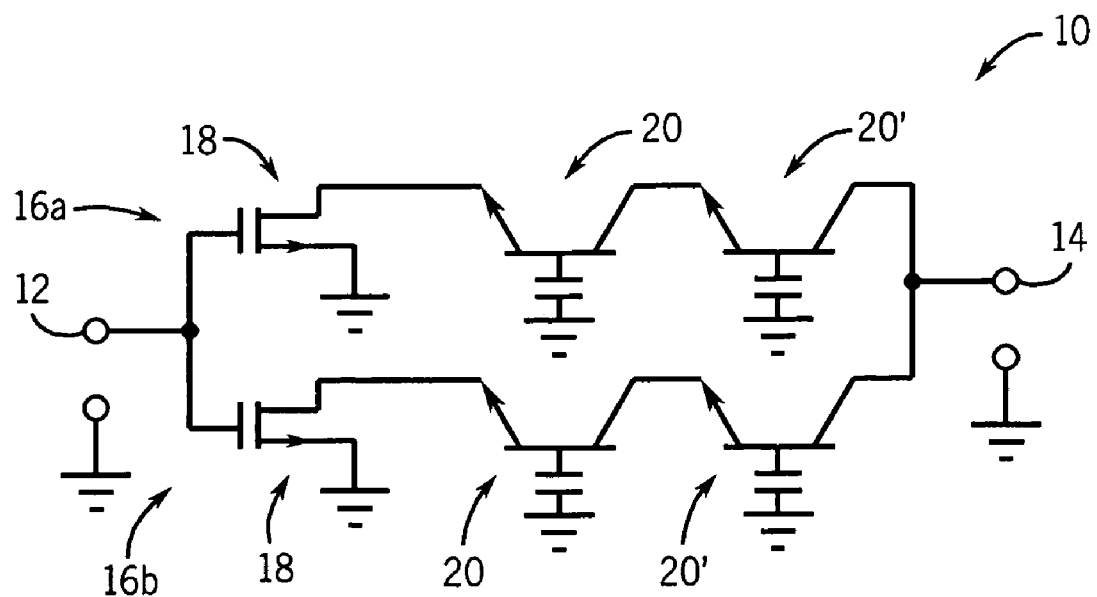
FIG. 8 is a figure similar to that of FIG. 1 showing a cascode connection of the bipolar junction transistors to provide improved breakdown voltage.

Referring now to FIG. 8, in an alternative embodiment of the amplifier cell 10, each of the bipolar transistors 20 may be replaced by two or three series connected bipolar transistors 20 and 20' to form a cascode stage that improves breakdown voltage of the series connected transistors as may be particularly important for small or high speed devices.

It is specifically intended that the present invention not be limited to the embodiments and illustrations contained herein, but include modified forms of those embodiments including portions of the embodiments and combinations of elements of different embodiments as come within the scope of the following claims.

We claim:

1. A high-power amplifier comprising: an input; a plurality of field-effect transistors receiving the input at gates of the field-effect transistors to produce driving signals through drains of the field-effect transistors a plurality of silicon bipolar transistors receiving the driving signals across emitter and bases of the silicon bipolar transistors; an output connected across collectors and bases of the plurality of silicon bipolar transistors; wherein the silicon bipolar transistors are operated under common-base configuration; wherein the silicon bipolar transistors have a predetermined relative doping concentration in a base region and an emitter region such that the doping in the base region is substantially increased with respect to the doping in the emitter region and a collector region such that a base resistance $r_b$ of each silicon bipolar transistor is less than or equal to a sum of an emitter resistance $r_e$ and a parasitic emitter resistance $r_{ex}$.

2. The amplifier of claim 1 wherein the silicon bipolar transistor is a silicon bipolar junction transistor.

3. The amplifier of claim 1 wherein the silicon bipolar transistor is a silicon germanium heterojunction transistor.

4. The amplifier of claim 1 wherein the high powered amplifier cell is constructed on an integrated circuit substrate further including complimentary metal oxide semiconductor logic providing input to the plurality of field effect transistors.

5. The high-power amplifier of claim 1 wherein each one of the field-effect transistors provide a driving signal to only one of the silicon bipolar transistors.

6. The high-power amplifier of claim 1 further including at least one field-effect transistor driving the input.

* * * * *